May 21, 1963 F. W. ANDERS 3,090,206

THERMOELECTRIC DEVICES AND CIRCUITS THEREFOR

Filed June 23, 1960 4 Sheets-Sheet 1

INVENTOR
FRANK W. ANDERS,

BY Lowry & Rinehart

ATTORNEYS

INVENTOR
FRANK W. ANDERS,
BY Lowry & Rinehart
ATTORNEYS

May 21, 1963 F. W. ANDERS 3,090,206

THERMOELECTRIC DEVICES AND CIRCUITS THEREFOR

Filed June 23, 1960 4 Sheets-Sheet 3

INVENTOR
FRANK W. ANDERS

BY Lowry & Rinehart

ATTORNEYS

THERMOELECTRIC DEVICES AND CIRCUITS THEREFOR

Filed June 23, 1960

4 Sheets-Sheet 4

INVENTOR
FRANK W. ANDERS,

BY Lowry & Rinehart

ATTORNEYS

United States Patent Office
3,090,206
Patented May 21, 1963

3,090,206
THERMOELECTRIC DEVICES AND CIRCUITS THEREFOR

Frank W. Anders, 2415 Elm St., Falls Church, Va.
Filed June 23, 1960, Ser. No. 38,225
33 Claims. (Cl. 62—3)

This invention relates to improved thermoelectric devices, to improved methods of making them, and to improved circuits for the use of such devices.

Since the discovery and development of the thermoelectric phenomena, a great deal of effort has been made to improve the basic thermoelectric devices and to apply them with economy and efficiency to practical applications having scientific and industrial significance.

The improvement of thermoelectric devices, hereinafter in this application called TE devices, involves the solution of a number of problems and limitations peculiar to said thermoelectric devices, or the circuits in which they are used.

In order to more concisely and accurately describe the objects of this invention, FIGURES 1 and 2 of the drawings, which will hereinafter be more completely described, have been directed to a diagrammatic showing of the basic known thermoelectric device and the two basic circuits in which said device is used. The Peltier effect, wherein the device is used as a heat pump, is shown in FIGURE 1. The Seebeck effect, wherein a heat source is used to generate electrical energy, is shown in FIGURE 2.

One of the major problems in the art of TE devices has been the handling of the relationship between the lengths and area of the legs of the thermocouples for optimum efficiency. To date, the magnitudes of $L_1$, $L_2$ and $A_2$, $A_1$ (FIGURES 1 and 2) have been dictated by practical engineering limitations rather than scientific optimums. The state of the art of forming thermoelectric materials into large areas and small lengths has been precluded by inadequate methods of preparing materials with good TE figures of merit and by inadequate methods of forming lossless junctions over the entire surface of the enlarged cross-sectional area. It is apparent that the larger TE cross-sectional leg areas ($A_1$ and $A_2$) would result in two improvements, namely, a reduction in the insulated space between TE legs, thereby reducing the thermal loss in the insulated area, and an increase in heat pumping and power generating efficiencies by bringing the junction closer to the working area. Both thermoelectric effects occur when the charge carriers pass the infinitesimal barrier space between the metallic and thermoelectric materials. Therefore, almost all losses, thermal and electrical, occur in the TE materials and surrounding space outside the barrier space.

The second major problem in this art is that of producing uniform TE materials, whether sintered, bouled, glassified, crystallized, or the like.

Still another major problem in this art, and perhaps the most important, is that of achieving TE devices which have a high overall figure of merit.

A further problem involves that of close contact between insulation materials, both electrical and thermal, and TE and junction materials.

It is an object of this application to provide a TE device which approaches a solution of the four major problems, said device having a higher overall figure of merit than any of the previously known devices, large area small length junctions, a uniform materials mass, and improved contact between insulation materials and TE and junction materials.

A further object is to provide a TE device which significantly reduces mass production costs.

A further object is to provide a simplified and practical method of making the improved TE devices of the invention.

Still another object is to provide structures involving applications of my basic improved TE device wherein the structures have major industrial significance.

Another object of the invention is to provide an improved TE circuit wherein the efficiency of the TE effect is highly improved over any circuit previously known.

A further object of the invention is to provide a combination of structure and applied circuitry having a performance which is superior to any known prior TE devices.

With the above and other objects in view, as will be presently apparent, the invention consists in general of certain novel details of construction and combinations of parts hereinafter fully described, illustrated in the accompanying drawings, and particularly claimed.

In the drawings, like characters of reference indicate like parts in the several views, and FIGURE 1 is an isometric view showing in schematic form the basic TE device of the prior art, the device employing the Peltier effect as a heat pump;

FIGURE 6(*a*) is a fragmentary view of a variation in handling the insulation in the modification of FIGURE 6;

Figure 1:
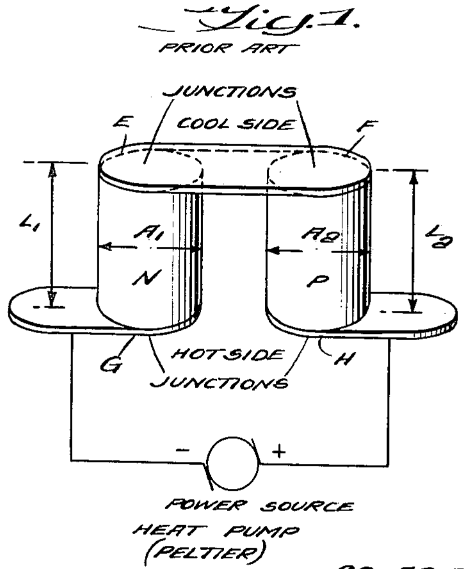
Figure 2:
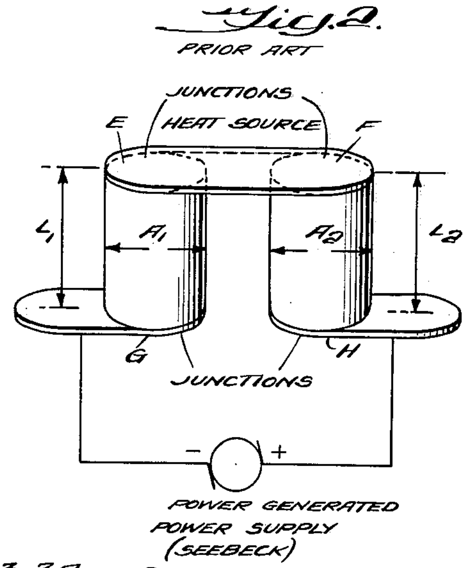
FIGURE 2 is an isometric view showing in schematic form the basic TE device of the prior art, the device employing the Seebeck effect to serve as a power supply.

In understanding the relationships involved in the present invention, the following equations are pertinent, and these may be considered with reference to FIGURES 1 and 2 of the drawings:

$$L_2A_1/L_1A_2=\sqrt{K_2R_1/K_1R_2} \quad (1)$$

(2) Peltier: $\Delta T_{max.} = \frac{1}{2} Z T_{Cm}^2$ (3) Seebeck: $\text{Eff.} = 1 - \epsilon^{-\int_{T_C}^{T_H} e_M d \ln T}$ (4) $e_M = \frac{\sqrt{1+ZT}-1}{\sqrt{1+ZT}+1}$ (5) $Z = \frac{(S_1+S_2)^2}{(K_1R_1+K_2R_2)^2} =$ (5a) $A\frac{u}{K_{ph}}\left(\frac{M_s}{M_o}\right)^{3/2}\left(2+\frac{E_g}{kT}\right)^2 \epsilon^{-\frac{E_g}{kT}}$ (6) $\frac{d \ln R}{dP} = \frac{d \ln R_\infty}{dP} + \frac{1}{2kT}\cdot\frac{dE_g}{dP}$ (7)
$$\Delta T = \frac{\frac{1}{2}\frac{W}{K}xl^2 - qT_cl}{ql+x} + 2l^2\sum_{n=1}^{\infty}\frac{\left[\frac{W}{K}x(\cos A_n - 1) + \frac{qT_c}{l}A_n \sin A_n\right]\epsilon^{-\frac{A_n^2at}{l^2}}}{A_n^2\left[A_n \sin A_n\left(x+\frac{2aC_o}{l}\right)+\left(\frac{\sin A_n}{A_n}-\cos A_n\right)\left(ql-\frac{aC_o}{l}\right)\right]}$$

Wherein:
$L_2, L_1$=TE material length
$A_2, A_1$=TE material cross sectional area
$K_2, K_1$=TE material specific thermal conductivity.
$R_2, R_1$=TE material specific electrical resistivity.
$S_2, S_1$=TE material thermal electric power or Seebeck coefficient.
$T_H$=Hot side temperature.
$T_C$=Cold side temperature.
$T_{C_m}$=Cold side temperature for $\Delta T_{max}$.
Z=TE figure of merit.
$e_M$=TE materials efficiency.
Eff.=Overall efficiency or output power/input power.
$M_O, A, R, \infty, k$=Constants.
$u$=Mobility.
$K_{ph}$=Phonon thermal conductivity.
$M_S$=Effective mass of carrier.
$E_g$=Band gap (Fermi).

$$\tan A_n = \frac{xlA_n}{ql^2 - C_oA_n^2}$$

$$C_o = \frac{C_c}{2A_{1,2}}$$

$$a = \frac{K}{c}$$

$q=S_{1,2}J$
$J$=Current density.
$n$=Summation number.
$P$=Pressure.
$Cc$=Heat capacity of metallic connecting layer.

Equation 1 gives the relationship between the lengths and areas of the legs of the thermocouples for optimum efficiency. For a given material, $K_1$, $K_2$, $R_1$, and $R_2$ are assumed to be constants (for small temperature variations). Therefore, $L_1A_2$=(const.) $L_2A_1$. It will later become apparent that larger TE leg areas ($A_1$ and $A_2$) are desirable if $L_1$, $L_2$ are to be held to a minimum. As previously pointed out, almost all losses, thermal and electrical, occur in the TE materials and the surrounding space outside the barrier space.

Equations 2, 3, 4, and 5 are given to show the significance of the figure of merit in both heat pumping (Peltier) and power producing (Seebeck) devices. It is evident from these equations that the figure of merit Z must be made as high as possible for almost all terrestrial applications, and some cosmic applications, certain exceptions occurring in other cosmic applications, or earth simulated applications. My invention is applicable to all conditions because the figure of merit can be controlled.

The theory underlying my invention is embodied in Equations 5*a*, 6 and 7. It will be noted that the figure of merit Z is proportional to the mobility *u*, the effective mass $M_S^{3/2}$, inversely proportional to the thermal (lattice) conductivity, and proportional to $(E_g)^2\epsilon^{-E_g}$. To date, all efforts have been directed toward optimizing the terms $$\frac{M_S^{3/2}}{K_{ph}}$$

where $(E_g)^2\epsilon^{-E_g}$ has been treated as a constant. This invention takes advantage of Equation 6 to change $E_g$ without affecting $$\frac{uM_S^{3/2}}{K_{ph}}$$

appreciably. The first term $$\frac{d \ln R_\infty}{dp}$$

in Equation 6 affects $$\frac{uM_S^{3/2}}{K_{ph}}$$

but its effect is small compared to the second term $$\frac{1}{2kT}\frac{dE_g}{dP}$$

The utilization of this effect is disclosed later in my application.

In prior research, since very little could be done to vary the term $$\left(2+\frac{E_g}{kT}\right)^2 \epsilon^{-E_g/kT}$$

in Equation 5*a*, all efforts were directed to optimizing the first term of Equation 5*a*, namely $$A\frac{u}{K_{ph}}\left(\frac{M_s}{M_o}\right)^{3/2}$$

In the present invention, normal methods are used to optimize the first term, such as sintering, crystallizing, bouling and the like, but particular attention is given to the second term, whereby the figure of merit of a higher order of magnitude can be achieved.

Equation 7 establishes a very important effect which applies to pulsed circuits, instantaneous heat pumping, power production and other non-stationary devices. It can be seen from this equation that a very large $\Delta T$ or a temperature change can be attained, for example, one to five times the stationary value, by the use of pulses of current. This effect occurs because Joulian heat formation lags the heat pumping action due to inertial drag. To obtain the optimum effect, the pulsing width (*t*) must be short compared to the pulse interval ($T_p$). See FIGURE 15. The maximum pulse current is limited primarily by the junction contact area, i.e., current density and the breakdown voltage of the junction, and the melting point of the materials.

*Pressurized TE Device*

The present invention involves, as pointed out in the objects stated above, an improved TE device and an improved method of making such a device.

Utilizing prior known techniques, it is extremely difficult to deposit practical and usable TE materials because of the exact proportion with which two or more elements must be combined. It is generally believed that the technique of deposition of the materials in a uniform manner would open TE devices to wholesale mass production. Not only would uniform large area and small length TE materials become feasible, but flocculent TE materials would also become available for cooling air and water by passing both elements directly through the flocculent material.

It is contemplated that the TE materials be deposited by electrodeposition, gravity, spallation and vacuum deposition, or by other normal methods of deposition, such as sintering, crystallizing, bouling, cold and hot pressing and the like. Electrodeposition methods deposit only one element at a time, and similar types of difficulties are inherent in the other types of deposition. The density achieved is above 90 percent but less than the desirable maximum. However, in carrying out the present invention, complete thermocouples, which are comparable to or better than those which would be formed by other methods mentioned above, are ultimately formed by heat and ultra high pressure treatments after the precise amounts of basic elements are established. In this case, densities as high as 99.9999 percent are achieved.

*Example.*—It was desired to produce a TE material comprising a 33⅓ percent $Bi_2Se_3$, 66 percent $Bi_2Te_3$, and ⅔ percent copper. Deposition took place in a ten percent solution of copper phthalocyanine, first by depositing successively Se on copper, Te on Se, and Bi on Se. This was done in a series of baths by adding an excess of each constituent and carrying out the electrodeposition until Faraday's law was satisfied. After each solution containing the excess elements was removed, the deposited elements and the enclosure were thoroughly washed with distilled water until less than one part in 10,000 impurities remained. The deposited TE materials were then put in an oven for 10–20 hours at approximately 80 percent of the melting temperature of the materials so that all organic traces were completely removed. Junctions of stainless steel were then put on by wet pressing with an extremely powerful press, pressures being applied starting at 5,000 pounds per square inch and ranging up to approximately 200,000 pounds per square inch. Pressing continued until a maximum $\Delta T$ was reached, this being determined by the use of the Harmon apparatus. It has been found that pressures in the range indicated give an unexpected optimum performance by effectively raising the figure of merit.

The above described process has successfully prepared ZnSb TE materials, both N and P type, and also $Bi_2Te_3$ +.05 percent Na. It is contemplated by this invention that similar techniques may be applied to most of the known thermoelectric materials. In carrying out the above described process, attention must be given to Equations 1 through 8, i.e., thermocouples must be cut into squares or cylinders of a size corresponding to $L_1A_2$= const. $L_2A_1$, pressure must be applied so that Z maximum occurs within a reasonable range of the strength of the containing materials. If the latter is not done, the material may become metallic. Utilization of this technique is made to develop many different geometrical shapes, including cylindrical and parallelepiped thermocouples.

In the drawings, schematic FIGURES 1 and 2, representing the prior art and showing the basic thermoelectric devices, have been previously described with the exception of the letters E, F, G and H. These reference letters represent the junctions of the thermoelectric device.

Figure 3:
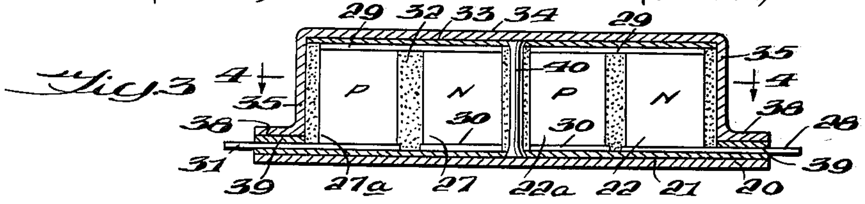
FIGURE 3 is a longitudinal sectional view of a TE device constructed in accord with the novel concepts of my invention, taken on the line 3—3 of FIGURE 4.
Figures 4, 5:
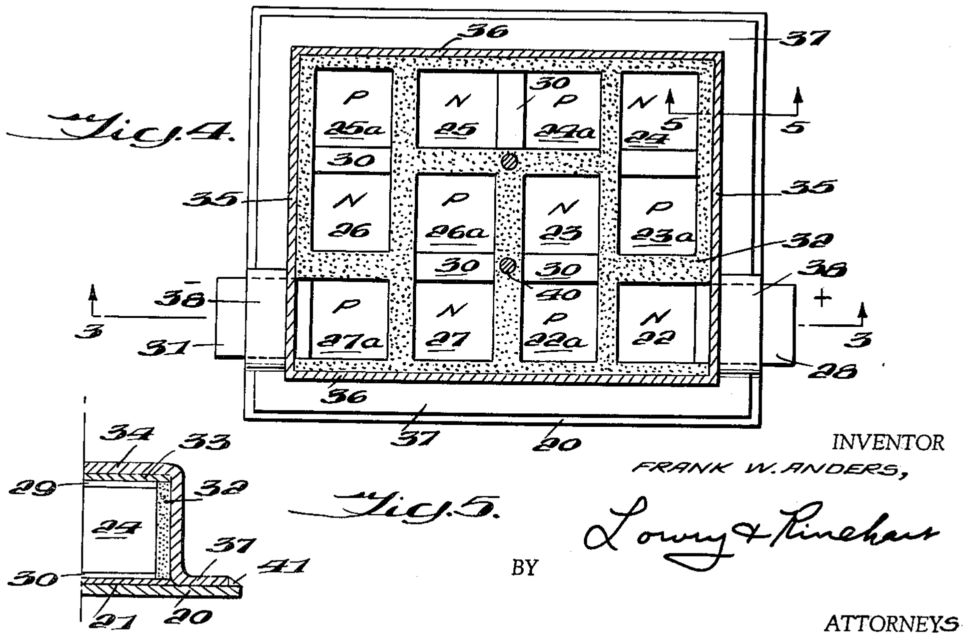
FIGURE 4 is a horizontal sectional view taken on the line 4—4 of FIGURE 3.
FIGURE 5 is a fragmentary sectional view taken on the line 5—5 of FIGURE 4.

Reference is now made to the thermoelectric device disclosed in FIGURES 3, 4 and 5 of the drawings. The reference numeral 20 indicates a base plate which is shown as rectangular in shape and which is preferably composed of a non-corrosive, high tensile strength steel. An alternate material would be a high tensile strength plastic. Positioned upon the base plate 20 is a layer of insulating material 21, preferably mica. The thermoelectric materials rest upon the insulating material 21 and are in the form of a group of couples connected in electrical series, bearing the reference numerals 22, **22*a*, 23, 23*a*, 24, 24*a*, 25, 25*a*, 26, 26*a*, 27, 27*a*. The N mass 22 is provided with a terminal connector plate 28, which is preferably of copper, nickel or steel, which is in molecular wet press couple with the mass N. Each N-P couple is provided with a top connector plate 29. Each P-N couple is provided with a bottom connector plate 30. The P mass 27*a* is provided with a terminal connector plate 31. The space between and around the P and N material is filled with insulating material 32. While in the drawings, for the purpose of clear disclosure, this space is shown as being substantial, in the actual manufacture of the device this space would be held, insofar as engineering practice is concerned, to thin film distances, i.e., .001 to .0001 inch. This spacing is made possible by the application of the ultra high pressure in the formed device. The close contact of the insulation reduces to a high degree the thermal and electrical leakage found in prior known structures. An insulating material 33, such as mica or deposited oxides or the like, is placed over the top of the P-N materials, and the entire assembly is provided with a cover 34. This cover has end walls 35 and side walls 36, and is further provided with an outwardly directed marginal flange 37. In order to permit the terminal connector plates 28 and 31 to extend through the assembly, the marginal flange 37 has raised portions 38 at the point where the terminal connector plates 28 and 31 extend through the casing. A small mass of insulation 39 cooperates with the insulation material 21 to insulate the terminal connector plates 28 and 31 from the metal casing. Tension rods 40 extend between the base plate 20 and the cover 34, the joint between the tension rods 40, the base plate 20 and the cover 34 being such that the tension rods will prevent bowing outwardly of the center area of the cover 34, assisting in maintaining as high pressure on the TE materials enclosed within. As shown in FIGURE 5, the base plate 20 preferably extends slightly beyond the marginal edge 37 of the cover, and a weld 41 joins the cover flange 37 to the base plate 20**.

The method of making the unit of FIGURES 3, 4 and 5 is as follows: The P and N materials are made in accordance with a process outlined earlier, such as by deposition techniques. The various connector plates 29, 30, 31 and 32 are joined to the P and N materials, and the various parts are then put together in the arrangement shown in FIGURE 3. The whole assembly, with the cover in place but not attached to the base plate, is then placed in a high capacity press. This press may apply pressures to the assembly as high as 200,000 pounds per square inch. This pressure is maintained while the cover marginal flange 37 is welded to the base plate 20 and while the tension rods 40 are fastened to the cover 34. This welding may be accomplished by a plasma beam in cooperation with a tungsten steel welding rod, care being taken that the TE materials are not exposed to the heat of the plasma beam. When the applied pressure is removed, the TE unit so formed holds the TE materials therein under a very high continued pressure.

Figure 6:
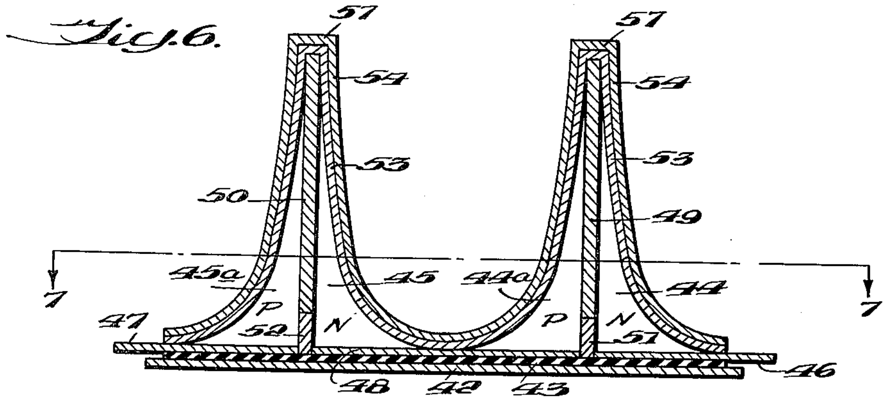
FIGURE 6 is a longitudinal sectional view of a modification of my improved TE device, taken on the line 6—6 of FIGURE 7.
Figure 7:
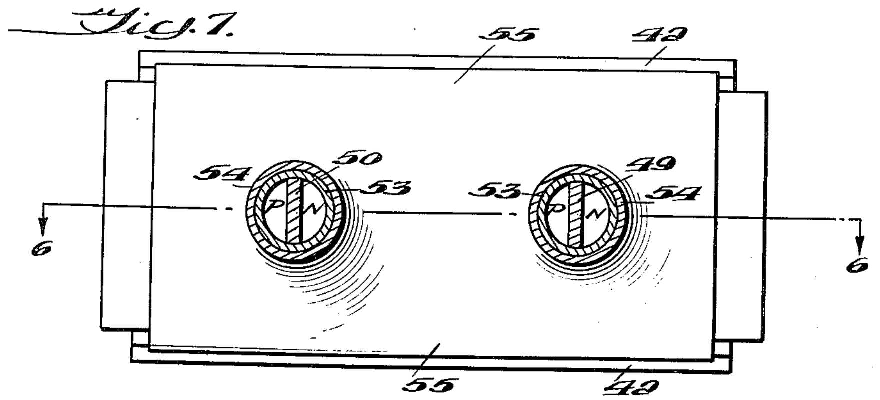
FIGURE 7 is a horizontal sectional view taken on the line 7—7 of FIGURE 6.

A modified basic unit is shown in FIGURES 6 and 7 of the drawings. This is a catenary type of unit, and presents several important advantages. For simplicity of disclosure, FIGURES 6 and 7 show a pair of couples forming a unit, but it will be understood that this unit could be constructed in a series including any number of catenary couples in end-to-end relationship, or even in a sizeable bank with any desired number of units connected in end-to-end and side-to-side relationship.

The device is provided with a base plate 42 which may be of high tensile steel or even a suitable high tensile strength plastic. Superimposed upon the base plate 42 is an insulation layer 43, such as mica. The P and N masses 44, 44a, 45 and 45a are positioned in accord with the methods set forth in another part of the application. The N mass is provided with a connector plate 46, and the P mass 45a is provided with a connector plate 47. The P mass 44a and the N mass 45 are connected by a connector plate 48. These connector plates rest upon the insulation 43. The N mass 44 and P mass 44a are separated by a plate 49, and a similar plate 50 separates the N mass 45 and the P mass 45a. These plates are preferably made of nickel, but they may be made of copper, stainless steel or any other suitable material. The plates 49 and 50, in the form shown in the drawings, do not extend for the full height of the P and N masses but terminate slightly above the bottom of said masses. Insulation strips 51 and 52 separate the lower ends of the P and N masses, and also separate the connector plates 46 and 47 from the connector plate 48. It is not necessary, however, that the plates 49 and 50 terminate above the bottom of the masses. In a second form, as shown in FIGURE 6(*a*), the plate 50 terminates at the base of the plates 47 and 48, and an insulating layer or non-conductive coating 52a is deposited on the lower end of said plate 50. This is preferably tapered in the manner shown in FIGURE 6(*a*), in order to achieve equal current densities along the junctions of the P and N masses with the plate 50. An insulation layer 53, of mica or the like, houses the catenary geometry of the P and N masses and the separating plates 49 and 50. The assembly is provided with a cover 54 which is shaped to conform to the geometry of the assembly. The cover terminates in a marginal flange 55 and this flange is joined to the base plate 42 by a welding operation in the same manner as described for the previous modification. The same manner of assembly and pressurizing of the unit pertains to the modification of FIGURE 6 as is described in connection with the FIGURES 3, 4 and 5.

There are several important and distinct advantages to the catenary geometry employed in the modification of FIGURES 6 and 7.

The catenary geometry will depend upon the ratio of the contact area between the N and P TE materials, and the contact area between the TE materials and the electrical conductor. This ratio should be made as close to unity as practical, to optimize the coefficient of performance and to minimize the cost of the power source. Furthermore, the length of the junction line between the N and P type TE materials should be as long as is practical. This geometry affords the maximum ratio of the bulk resistance to the junction resistance, the low ratio of bulk resistance to junction resistance being the major deterrent affecting TE materials at the present time. The preferred form from the thermodynamic point of view would be a spire shaped head. This is obviously impractical, and the disclosed catenary geometry is in the form of a practical compromise. The requirements just set forth are fulfilled to the maximum degree possible while a practical structure is retained. Greater pressures can be applied to this type of geometry than to other types, and the applied pressures are more efficiently retained by this structure when the high capacity press is removed. Further, the catenary design presents certain practical and highly efficient arrangements for the actual use of the TE unit, as will be hereinafter described.

Figures 6A, 8:
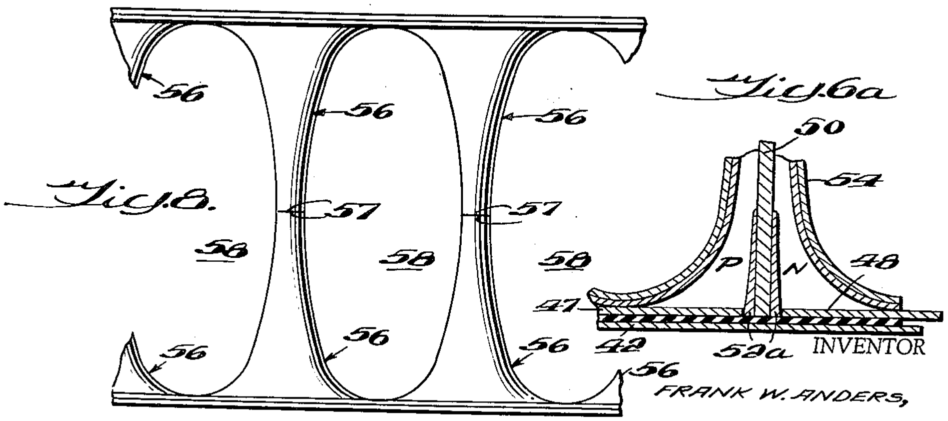
FIGURE 8 is a fragmentary side elevational view of a modification of my invention, showing two catenary units of the type shown in FIGURES 6 and 7.

An example of this is shown in the fragmentary view of FIGURE 8. FIGURE 8 shows a series of catenary heads 56 placed in end-to-end relationship. The two units so formed are then oriented so that the ends 57 of the catenary heads are adjacent and fastened together. The spaces 58 defined by this arrangement, when the assembly is provided with suitable side and end walls, provide excellent passages through which a confined fluid may pass in heat exchange relationship to the catenary heads.

Figures 13, 14, 15:
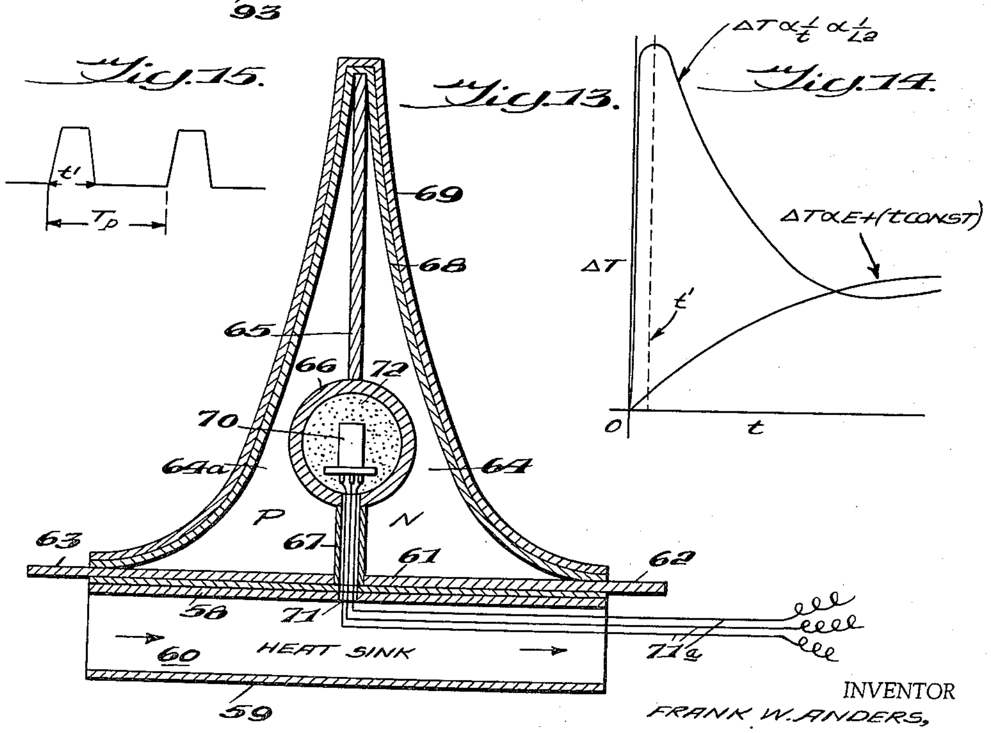
FIGURE 13 is a longitudinal sectional view of another modification of my invention, showing the improved catenary type of TE device as combined with a transistor for transistor cooling.
FIGURE 14 is a graph illustrating the relationship of $\Delta T$ or the temperature change and $t$ in my improved pulsing circuit and showing the startling effect obtained by pulsing the current.
FIGURE 15 is a graph illustrating the type of pulse which is applied.

FIGURE 13 of the drawings discloses a modification wherein the catenary unit, as basically described in FIGURES 6 and 7, may be constructed to serve a specific purpose with great efficiency. The unit is provided with a base plate 58 and a spaced plate 59 which, in conjunction with the base plate 58, defines a fluid passage. In this case, a Peltier circuit would be used, and the base plate 58 would form the hot side of the couple. A fluid passing through the heat sink 60 would carry away the heat generated at the hot side. The unit is provided with an insulating layer 61, the connector plate 62, and the connector plate 63. There is further provided the catenary shaped N mass 64 and catenary shaped P mass 64a. A connector plate 65 is positioned between the P and N masses, and to this plate is attached the sphere 66 of the same material as the plate. This sphere may be formed in two sections for purposes of assembly. An insulation mass 67 below the lower end of the sphere separates the lower end of the P and N masses and further separates the connector plates 62 and 63. The assembly is provided with the insulating layer 68 and the cover 69, in the manner previously defined. Within the sphere before final assembly may be placed an electrical component which is to operate under the cooling conditions provided by the TE device. In FIGURE 13, a transistor 70 occupies this space. A passage 71 is provided through the insulating mass 67, the insulation layer 61 and the base plate 58, and suitable leads 71a are connected to any desired electrical circuit. The space within the sphere may be filled with insulation 72, or it is contemplated that a thermally conductive plastic of suitable type may be poured about the enclosed unit. The plastic would provide a very high resistance to the high pressure of encapsulation. It will be understood that enclosed unit 70 is not limited to disclosure of the transistor, and other types of units could be enclosed, such as Esaki diodes, printed circuits and infra-red cells. Further, the enclosure need not be in the shape of a sphere 66. It is contemplated that the enclosure may conform closely to the shape of the unit being housed, if desired.

*Improved Pulsing Circuit*

In FIGURES 9, 10, 11 and 12, there has been disclosed a TE circuit of maximum efficiency and of very great adaptability to practical uses. In the structure disclosed, the improved pulsing circuit has been applied to a structure formed from a grouping of the pressurized catenary type units shown in FIGURES 6 and 7. The combination of the improved basic unit and the pulsing circuit is of significance in the art, but it is to be understood that in the broader aspects of the concept, it would not be necessary to use the improved pressurized catenary type unit. While the performance and efficiency of the structure would be considerably less, it is possible to apply a series of TE units as known in the prior art in the combination, wherein the circuit is pulsed, and the assembly is operative.

Figure 9:
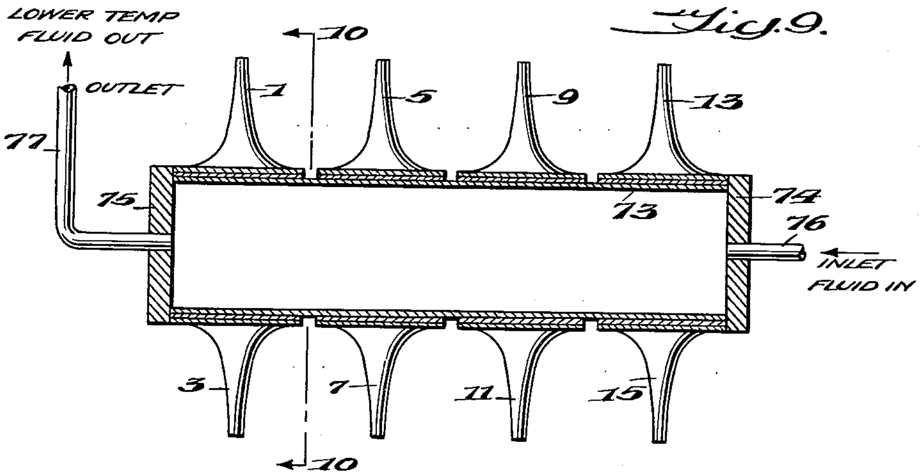
FIGURE 9 is a longitudinal sectional view of a TE device employing my basic catenary unit, taken on the line 9—9 of FIGURE 10.
Figures 10, 11:
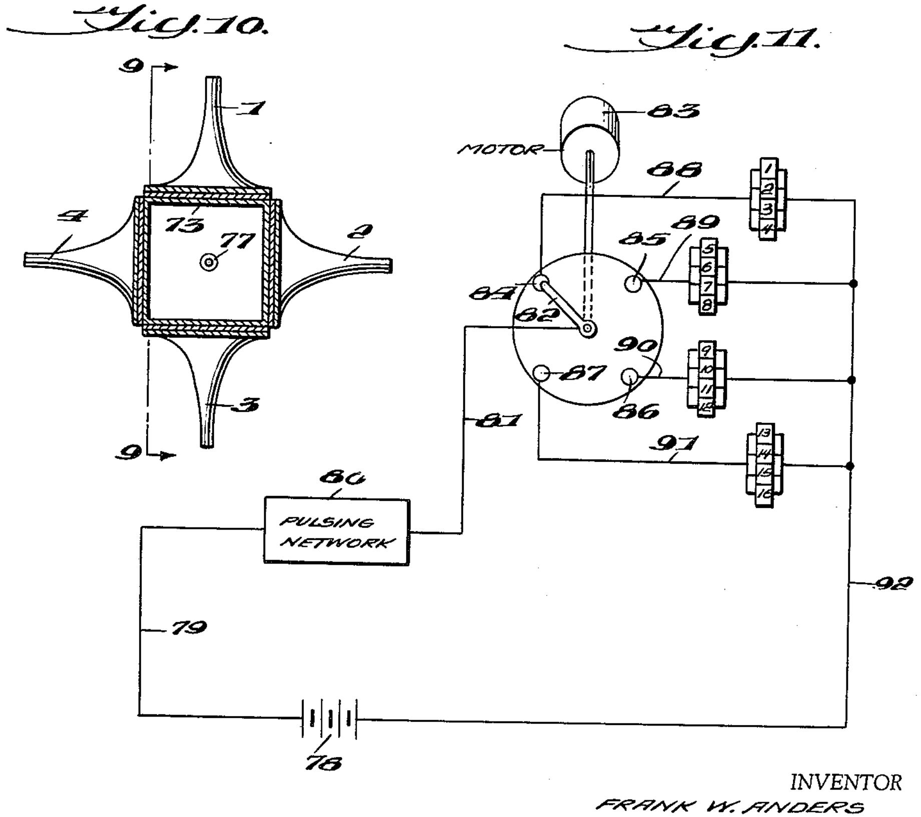
FIGURE 10 is a cross-sectional view of the device of FIGURE 9, taken on the line 10—10 thereof.
FIGURE 11 is a schematic view of a new and novel TE circuit, which preferably employs a TE device of the structure shown in FIGURES 9 and 10.
Figure 12:
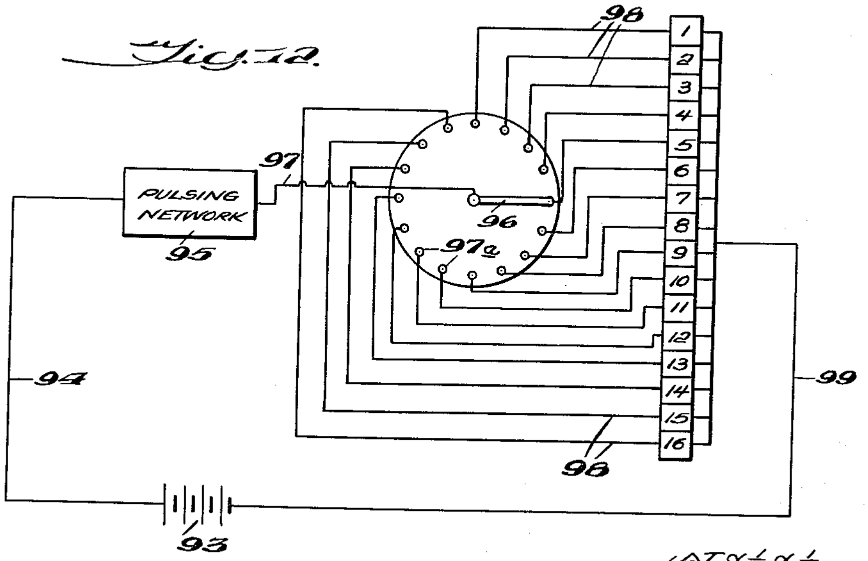
FIGURE 12 is a schematic view of a further modification of my invention, showing another novel TE circuit which preferably employs a TE device of the structure shown in FIGURES 9 and 10.

FIGURES 9 and 10 show the details of the physical structure of TE device to which the modified circuits in FIGURES 11 and 12 are preferably applied. The structure shown in FIGURES 9 and 10 will be first described in detail, and the relationships of FIGURES 11 and 12 to the structure of FIGURES 9 and 10 will then be set forth. It may be pointed out that the pulsing circuits of FIGURES 11 and 12 can be applied to a group of TE devices in any functional arrangement, and the invention involved in the circuit is not necessarily restricted to the specific physical arrangement of FIGURES 9 and 10. In its broader aspects, the invention covers the application of the circuit to any grouping of multiple TE devices.

In FIGURES 9 and 10, there is shown a fluid duct 73 which provides for fluid passage. The duct may be capped with the ends 74 and 75. There is a fluid inlet 76 and a fluid outlet 77. Arranged on the far sides of the fluid duct 73 are a group of catenary heads bearing the reference numerals 1 through 16. These heads are single units of the general type shown in FIGURES 6 and 7. The leads of these units are connected in a circuit which assumes either the schematic arrangement shown in FIGURE 11 or the modified arrangement shown in FIGURE 12.

In the circuit of FIGURE 11, there is provided a potential source 78. The lead 79 extends to a pulsing network 80. The pulsing network 80 may take a number of forms, the details of which are not essential to the present invention. This network should be capable of forming a pulse of the type shown in diagrammatic form in FIGURE 15, which will be described later in more specific detail. The lead 81 is in electrical connection with a rotatable distributing arm 82. This arm is rotated by the motor 83 at a constant speed. The arm 82 makes successive electrical connection with the contacts 84, 85, 86 and 87, respectively. A lead 88 extends from the contact 84 to the catenary heads 1, 2, 3 and 4, which are connected in parallel. In similar fashion, the lead 89 connects the contact 85 with the catenary heads 5, 6, 7 and 8, the lead 90 connects the contact 86 with the catenary heads 9, 10, 11 and 12, and the lead 91 connects the contact 87 with the catenary heads 13, 14, 15 and 16. Each of the leads 88, 89, 90 and 91 joins the main circuit lead 92 and the circuit is thence completed to the potential source 78.

It will thus be seen that by this arrangement the four groups of catenary heads are actuated cyclically in a repeating series. In the modification shown in FIGURE 12, there is a potential source 93. A lead 94 extends to the pulsing network 95, which is similar to the pulsing network 80 in the previous modification. A rotatable motor driven arm 96 is in electrical connection with a lead 97 from the pulsing network. A plurality of contacts **97*a* are contacted in sequence by the rotatable arm 96. A series of parallel leads 98 extend to the separate catenary heads 1 through 16, respectively, and each of the catenary heads is then connected to the branch 99 of the main circuit, which leads to the potential source 93**. In this arrangement, current is applied cyclically to each of the catenary heads in succession.

As the graph of FIGURE 14 shows, the time required to reach maximum $\Delta T$ varies inversely as the square of the length of the TE material. It also shows that the maximum $\Delta T$ is proportional to the magnitude of the impressed step current. The current develops a skin effect causing the electrons which are carrying heat to go to the outer surface of the TE material. In the combination involved in FIGURES 9 through 12, the TE effect is optimized in that (1) there is decreased contact resistance due to high pressure; (2) there is decreased thermal transport through the insulating materials; and (3) the ratio of the bulk resistance to the contact resistance is increased.

In the improved circuit shown in FIGURE 11, maximum $\Delta T$ is obtained through use of current pulses applied successively to groups of four or more catenary or other type thermoelectric units in such a manner that by the time all of the couples have been pulsed, the first couple has reached an ambient temperature. In other words, the Joulian heat developed during the pulse has been absorbed in the heat sink defined by the fluid duct 73. With reference to FIGURE 9, it is noted that a high energy fluid passes successively under each group of couples, releasing an optimum amount of heat energy to the couple by the time a particle of the fluid has reached the discharge end of the device. Thus, as much as 60 to 95 percent of the initial heat energy of the fluid passing through the heat sink has been removed.

In the circuit of FIGURE 12, a similar effect is obtained except that the catenary heads rather than being pulsed in groups of four are pulsed one at a time in succession.

The pulsing network and the distributor network must be so designed that the $\Delta T$ maximum, as indicated in FIGURE 14, occurs at the end of the pulse. The ratio $t'$ to $T_p$, as shown in FIGURE 15, should correspond to the solution of Equation 7 in such a way that I maximum does not exceed the fusion or melting point of any of the elements in the TE couple. Furthermore, the period $T_p$ must be long enough to allow approximately 100 percent of the Joulian heat developed during the time $t'$ to be dissipated. The arrangement of FIGURES 9 through 12 is limited in the rate of flow of the fluid through the heat sink by the amount of heat which can be projected into the heat sink; in other words, if the heat sink is water or moving air at a temperature of 10° C. or less, the rate of flow of the fluid through the heat source is limited only by the head pressure, the number of couples, and the length of the heat source area. In the circuits involved, the pulsing networks 80 and 95 provide a pulse length $t'$ which takes advantage of the $\Delta T$ maximum, and the pulse interval T is controlled for maximum heat dissipation. In other words, there is a short sustained pulse, an interval, a short sustained pulse, another interval, and this is continued in cyclic form.

In its broader aspects, the invention is not limited to the particular pulsing sequences as set forth in FIGURES 9 through 12. Each of the thermocouples may be pulsed in succession, selected groups may be pulsed in succession, or the whole bank may be pulsed at once, depending upon the following considerations. If maximum $\Delta T$ is required, then each thermocouple should be individually successively pulsed by the distributor. If the power capability of the potential source is in question, then a design should be used which would best match the load resistance to the battery resistance, in which case selected groups may be pulsed.

While there are herein shown and described the preferred forms and modifications of the invention, it is to be understood that variations may be made therein without departing from the spirit and scope of the invention as claimed. For example, solid state switching networks are now available having no moving parts, and capable of switching currents well beyond those required in thermoelectric applications. These would be substituted for the rotary switching arms 82 and 96 in FIGURES 11 and 12.

What is claimed is:

1. In a thermoelectric device, a casing, at least one thermocouple housed within and completely enclosed by said casing, said thermocouple comprising P and N masses, respectively, a conductor connecting said masses, and a terminal conductor extending from each of said masses respectively, said casing including a base and a head, said head tapering inwardly from said base toward the outer end thereof, said P and N masses and said connector plate conforming to the geometric shape of said head.

2. In a thermoelectric device, a casing, at least one thermocouple housed within and completely enclosed by said casing, said thermocouple comprising P and N masses, respectively, a conductor connecting said masses, and a terminal conductor extending from each of said masses, respectively, said casing including a base and a head connected to said base, said head tapering inwardly from said base toward the outer end thereof, said P and N masses and said connecting conductor conforming to the geometric shape of said head, said casing exerting a relatively high compressive force upon said thermocouple.

3. In a thermoelectric device, a casing, at least one thermocouple housed within and completely enclosed by said casing, said thermocouple comprising P and N masses, respectively, a conductor connecting said masses, and a terminal conductor extending from each of said masses, respectively, said casing including a base and a head connected to said base, said head tapering inwardly from said base toward the outer end thereof in the form of a catenary curve, said P and N masses and said connecting conductor conforming to the geometric shape of said head.

4. In a thermoelectric device, a casing, at least one thermocouple housed within and completely enclosed by said casing, said thermocouple comprising P and N masses, respectively, a conductor connecting said masses, and a terminal conductor extending from each of said masses, respectively, said casing including a base and a head connected to said base, said head tapering inwardly toward the center and outwardly from said base and defining a catenary curve, said P and N masses and said connecting conductor conforming to the geometric shape of said head, said casing exerting a relatively high compressive force on said thermocouple.

5. In a thermoelectric device, a casing, at least one thermocouple housed within and completely enclosed by said casing, said thermocouple comprising adjacent P and N masses, respectively, said masses having inner and outer faces, a conductor connecting said masses, and a terminal conductor extending from each of said masses, respectively, said casing including a base and a head connected to said base, said head tapering outwardly from said base in the form of a catenary curve, said P and N masses conforming to the geometric shape of said head, said connecting conductor being in the form of a plate positioned between the inner faces of said masses, said plate conforming to the geometric shape of said head, said casing exerting a relatively high compressive force on said thermocouple.

6. In a thermoelectric device, a casing, a plurality of thermocouples housed within said casing and completely enclosed thereby; each of said thermocouples comprising a P mass, an N mass, a conductor connecting each of said masses, and a terminal conductor extending from each of said masses; means extending through said casing for electrical connection of said thermocouples with an electrical circuit, said thermocouples being subjected to relatively high compression exerted by said casing, and tension rods extending between the opposed walls of said casing whereby pressure forces exerted on the walls by the compressed thermocouples will not bow the walls of said casing outwardly.

7. In a thermoelectric device, a pair of spaced bases, a plurality of casing heads extending inwardly from each of said bases, each of said heads being connected to a base and tapering inwardly in the direction of the opposed base, each of said heads containing a thermocouple comprising an N mass, a P mass, a conductor connecting said masses, and a terminal conductor from each of said masses, respectively, the free end of each of said heads being in alignment with and in engagement with a corresponding head on said opposite base.

8. In a thermoelectric device, a casing, at least one thermocouple housed within and completely enclosed by said casing, a thermocouple comprising a P mass, an N mass, a conductor connecting said masses forming a thermoelectric junction, and terminal conductors extending from said P and N masses, respectively, said connecting conductor having a hollow portion, said hollow portion forming a housing completely enclosing an electrical component, and means for conducting the lead wires from said component to the exterior of said casing.

9. A thermoelectric device as set forth in claim 8, wherein said hollow portion has a shape conforming to the shape of the said housed component.

10. A thermoelectric device as set forth in claim 8, wherein said hollow portion is in the form of a sphere.

11. A thermoelectric device as set forth in claim 8, wherein said hollow portion is filled with a hardened thermal conductive plastic which envelops the said housed component.

12. In a thermoelectric device, a casing, at least one thermocouple housed within and completely enclosed by said casing, said thermocouple comprising a P mass, an N mass, a conductor connecting said masses forming a thermoelectric junction, and terminal conductors extending from said P and N masses, respectively, said connecting conductor having a hollow portion, said hollow portion forming a housing for an electrical component, and means for conducting lead wires from said component to the exterior of said casing, said thermocouple being subjected to a relatively high compression exerted by said casing.

13. In a thermoelectric device, a casing, at least one thermocouple housed within and completely enclosed by said casing, said thermocouple comprising a P mass, an N mass, a conductor connecting said masses and a terminal conductor extending from each of said masses, respectively, said casing including a base having a head connected thereto, said head tapering toward its free end, said connecting conductor having a hollow portion, said hollow portion forming a housing for an electrical component, and means for conducting the lead wires from the said component to the exterior of said casing, said thermocouple being subjected to a relatively high compression exerted by said casing.

14. In a thermoelectric circuit, a potential source, a thermoelectric device connected across said potential source, and means for cyclically pulsing said circuit, said means being so timed that the end of each of said pulses coincides approximately with the maximum $\Delta T$ of said thermoelectric device.

15. In a thermoelectric circuit, a potential source, a thermoelectric device connected across said potential source, and means for cyclically pulsing said circuit, said cycle comprising a short sustained current pulse followed by a longer interval of less current relative to the length of said pulse.

16. In a thermoelectric circuit, a potential source, a thermoelectric device connected across said potential source, and means for cyclically pulsing said circuit, said cycle comprising a short sustained current pulse followed by a longer interval of less current relative to the length of said pulse, the said cycle being so timed that the end of the short sustained pulse coincides approximately with the maximum $\Delta T$ of the thermoelectric device, and the interval occurs during the decline of the $\Delta T$ due to Joulian heat formation.

17. In a thermoelectric circuit, a potential source, a plurality of adjacent thermoelectric devices, distribution means for cyclically connecting said thermoelectric devices one after another into said circuit, and means for cyclically pulsing said circuit.

18. In a thermoelectric circuit, a potential source, a plurality of adjacent thermoelectric devices, distribution means for cyclically connecting said thermoelectric devices one after another into said circuit, and means for cyclically pulsing said circuit, said means being to timed that the end of each of said pulses coincides approximately with the maximum $\Delta T$ of each of the thermocouples.

19. In a thermoelectric circuit, a potential source, a plurality of adjacent thermoelectric devices, distribution means for cyclically connecting said thermoelectric devices one after another into said circuit, and means for cyclically pulsing said circuit, said cycle comprising a short sustained current pulse followed by a longer interval of less current relative to the length of said pulse, said cycle being so timed that the end of each of said pulses coincides approximately with the maximum $\Delta T$ of each of the thermoelectric devices.

20. In a thermoelectric circuit, a potential source, a plurality of adjacent thermoelectric devices, distributor means for cyclically connecting selected groups of said thermoelectric devices into said circuit, and means for cyclically pulsing said circuit.

21. In a thermoelectric circuit, a potential source, a plurality of adjacent thermoelectric devices, distributor means for cyclically connecting selected groups of said thermoelectric devices into said circuit, and means for cyclically pulsing said circuit, said means being so timed that the end of each of said pulses coincides approximately with the maximum ΔT of each of the thermocouples.

22. In a thermoelectric circuit, a potential source, a plurality of adjacent thermoelectric devices, distributor means for cyclically connecting selected groups of said thermoelectric devices into said circuit, and means for cyclically pulsing said circuit, said cycle comprising a short sustained current pulse followed by a longer interval of less current, relative to the length of said pulse, said cycle being so timed that the end of the pulse coincides approximately with the maximum ΔT of each of the thermoelectric devices.

23. In a thermoelectric circuit, a potential source, a plurality of adjacent thermoelectric devices, said thermoelectric devices being positioned on a common heat sink, means for supplying fluid to said heat sink, distributor means for cyclically connecting selected thermoelectric devices in said circuit, and means for cyclically pulsing said circuit.

24. A thermoelectric circuit as set forth in claim 23, wherein said means is timed so that the end of each of said pulses coincides approximately with the maximum ΔT of each couple.

25. A thermoelectric circuit as set forth in claim 23, said cycle comprising a short sustained current pulse followed by a longer interval of less current relative to the length of said pulse, said cycle being so timed that the end of the pulse coincides approximately with the maximum ΔT of each of the thermoelectric devices.

26. In a thermoelectric circuit, a potential source, a thermoelectric device connected across said potential source, said thermoelectric device including a casing, at least one thermocouple housed within and completely enclosed by said casing, said theromocouple comprising P and N masses, respectively, and a conductor connecting said masses, conductor terminals extending from said P and N masses, respectively, said thermocouple being subjected to a relatively high compression exerted by said casing, and means for cyclically pulsing said circuit.

27. A thermoelectric circuit as set forth in claim 26, wherein said means is to timed that the end of each of said pulses coincides approximately with the maximum ΔT of the said thermoelectric device.

28. A thermoelectric circuit as set forth in claim 26, wherein said cycle comprises a short sustained current pulse followed by a longer interval of less current relative to the length of said pulse, said cycle being so timed that the end of the pulse coincides approximately with the maximum ΔT of the thermoelectric device.

29. In a thermoelectric circuit, a potential source, a thermoelectric device connected across the potential source, said thermoelectric device comprising a casing, at least one thermocouple housed in and completely enclosed by said casing, said thermocouple comprising P and N masses, respectively, a conductor connecting said masses, and a terminal conductor extending from each of said masses, respectively, said casing including a base and a head connected to said base, said head tapering inwardly from said base toward the outer end thereof in the form of a catenary curve, said P and N masses and said conductor conforming to the geometric shape of said head, and means for cyclically pulsing said circuit.

30. A thermoelectric circuit as set forth in claim 29, wherein said cycle is to timed that the end of each of said pulses coincides approximately with the maximum ΔT of the thermoelectric unit, and the interval occurs during the decline of the ΔT due to Joulian heat formation.

31. A thermoelectric circuit as set forth in claim 29, said cycle comprising a short sustained current pulse followed by a longer interval of less current relative to the length of said pulse, the said cycle being so timed that the end of the short sustained pulse coincides approximately with the maximum ΔT of the thermoelectric unit, and the interval occurs during the decline of the ΔT due to Joulian heat formation.

32. In a thermoelectric device, a casing, at least one thermocouple housed within and completely enclosed by said casing, said thermocouple comprising a P mass, an N mass, terminal conductors extending from said P and N masses, respectively, each of said P and N masses having an inwardly directed face, a conductor connecting said faces, said conductor forming a thermoelectric junction, an electrical component held by said conductor between said faces, and means for conducting terminal wires from said component to the exterior of said casing.

33. In a thermoelectric device, a casing, at least one thermocouple housed within and completely enclosed by said casing, said thermocouple comprising P and N masses, respectively, and a conductor connecting said masses, conductor terminals extending from the said P and N masses, respectively, to the exterior of said casing, said thermocouple being subjected to a relatively high compression exerted by said casing, said compression involving pressures in excess of 5,000 pounds per square inch.

References Cited in the file of this patent

UNITED STATES PATENTS

| | | |
|---|---|---|
| 2,289,152 | Telkes | July 7, 1942 |
| 2,352,056 | Wilson | June 20, 1944 |
| 2,700,114 | Blythe | Jan. 18, 1955 |
| 2,938,357 | Sheckler | May 31, 1960 |
| 2,957,315 | Wood | Oct. 25, 1960 |
| 2,990,481 | Standing | June 27, 1961 |
| 2,992,539 | Curtis | July 18, 1961 |
| 3,018,631 | Bury | Jan. 30, 1962 |

OTHER REFERENCES

RCA, TN, No. 304 and No. 305, November 1959 (2 sh. drwg., 1 p. each).